United States Patent [19]

Tokunaga et al.

[11] 4,015,143
[45] Mar. 29, 1977

[54] SEMICONDUCTOR SWITCH

[75] Inventors: Michio Tokunaga, Zushi; Ichiro Ohhinata, Yokohama; Shinzi Okuhara, Fujisawa, all of Japan

[73] Assignee: Hitachi, Ltd., Japan

[22] Filed: Mar. 7, 1975

[21] Appl. No.: 556,326

[30] Foreign Application Priority Data

Mar. 11, 1976 Japan .................... 49-27115
July 19, 1974 Japan .................... 49-82185

[52] U.S. Cl. .............. 307/252 J; 307/252 A; 307/252 G; 307/252 N; 357/38
[51] Int. Cl.² ........................ H03K 17/72
[58] Field of Search ...... 307/252 A, 252 D, 252 G, 307/252 H, 252 J, 252 N, 255, 305, 313; 357/38

[56] References Cited

UNITED STATES PATENTS

| | | | |
|---|---|---|---|
| 3,517,280 | 6/1970 | Rosier | 307/305 X |
| 3,641,403 | 2/1972 | Nakata | 357/38 |
| 3,725,683 | 4/1973 | Andersen | 307/305 |
| 3,812,405 | 5/1974 | Clark | 357/38 |

*Primary Examiner*—John Zazworsky
*Attorney, Agent, or Firm*—Craig & Antonelli

[57] ABSTRACT

A semiconductor switch large in $dv/dt$ bearing capacity regardless of the anode or cathode potential, high in breakdown voltage, capable of being closed with a small control current, and easy to be included in semiconductor integrated circuits. The semiconductor switch according to the invention comprises a PNPN switch having an equivalent PNPN four-layer construction with three junctions and an active circuit network including at least one transistor. The active circuit network combines with part of a positive feedback loop in the PNPN switch to form a negative feedback circuit network. The transistor forming part of the active circuit network is connected in such a manner as to divide one of the gate currents of the PNPN switch.

9 Claims, 12 Drawing Figures

SEMICONDUCTOR SWITCH

The present invention relates to a semi-conductor switch having three PN junctions of a fourlayer equivalent construction of PNPN used as a switching element such as a control device.

Semiconductor switches of PNPN construction (hereinafter referred to as a PNPN switch) include a PNPN diode with only an anode and a cathode taken out, a three-terminal thyristor with a cathode gate control terminal taken out in addition to the anode and the cathode, and also a four-terminal thyristor with an anode gate control terminal taken out additionally. They are used with various control devices as a switch having a self-holding function.

These PNPN switches, however, have the disadvantage that, in their cut-off state, they are undesirably closed upon application of a rapid forward voltage between their anode and cathode. This is known as the $dv/dt$ effect or rate effect, and a number of methods have been suggested to avoid this phenomenon.

Some common methods consist in connecting a resistor between the cathode gate $G_K$ and cathode K of the PNPN switch or in connecting a resistor to the anode gate $G_A$ of the PNPN switch so that the switch is reversely biased between the anode A and anode gate $G_A$ with an end of the resistor maintained at a high potential. In the former method, it is necessary to reduce greatly the resistance value of the resistor in order to obtain a capability for prevention of the erroneous turning on of PNPN switch due to transient voltage ($dv/dt$) (hereinafter referred to as a $dv/dt$ bearing capacity), due to the fact that the voltage drop across the resistor must not exceed the built-in voltage between the cathode gate $G_K$ and cathode K, even though the displacement current flows in the resistor through the junction capacity between the cathode gate and the anode gate. Assuming the junction capacity to be zpF, for instance, the resistance value of the resistor must be lower than 600Ω, if the $dv/dt$ bearing capacity of 500v/μs is to be achieved. As a result, the gate driving current and holding current are increased by the amount of current flowing in the resistor, leading to the disadvantage that in the case under consideration, for instance, a superflous driving current of approximately 1mA is required. The latter method, on the other hand, requires that an end of the resistor be maintained at higher potential than the anode, and has the disadvantage that the device is capable of being protected when the anode changes to a higher potential whereas it is not when the cathode changes to a lower potential.

A conventional semiconductor switch most analogous to the present invention is shown in FIGS. 1 and 2 as disclosed in the U.S. Pat. No. 3,609,413. Incidentally, component elements in FIG. 1 and FIG. 2 are denoted by the same reference numerals as those in FIG. 1 and FIG. 3 of the drawings attached to the specification of the quoted patent.

By utilizing the junction capacity between an emitter 19 and the base of the transistor $T_3$ in the case of FIG. 1 and the capacitor 34 in the case of FIG. 2, a transient voltage applied to the anode is differentiated and the transistor $T_3$ or $T_5$ is energized in order to prevent the $dv/dt$ effect of the PNPN switch 10 (shown as SCR 10 in the quoted patent). In the circuit of FIG. 1 having an emitter 19, base and another emitter 18 of the transistor $T_3$ connected between the anode and cathode, the breakdown voltage of the base-emitter junction is at most 5 to 10V, thus making this circuit usable only at about 5V or less, resulting in the loss of the advantage of a PNPN switch that the breakdown voltage thereof is high both in positive and negative directions. By contrast, the circuit shown in FIG. 2 has the shortcoming of the difficulty encountered in producing it in the form of integrated circuitry since the capacitor 34 is included. Further, in such an application of the circuits of FIG. 1 and FIG. 2 as the case where pulses arriving at the anode at a high speed of, say, 1ms in period are alternately used for firing and cutting off the device, useless charges remain in the base of the transistor $T_3$ or $T_5$, resulting in the $dv/dt$ bearing capacity being greatly reduced.

Accordingly, it is an object of the present invention to provide a semiconductor switch of PNPN construction having a large $dv/dt$ bearing capacity regardless of the potential of the anode or cathode.

Another object of the invention is to provide a semiconductor switch of PNPN construction having a large $dv/dt$ bearing capacity on one hand and high positive and negative breakdown voltages.

A further object of the invention is to provide a semiconductor switch of PNPN construction which is capable of being closed with a small control current.

Still another object of the invention is to provide a semiconductor switch of PNPN construction which is easily included in semiconductor integrated circuits.

Still another object of the invention is to provide a semiconductor switch with a large $dv/dt$ bearing capacity in which a PNPN switch is capable of being closed with a low control voltage and small control current against variations in the cathode potential level.

According to the present invention, there is provided a semiconductor switch comprising a PNPN switch of a four-layer equivalent construction of PNPN and including an N-type gate and a P-type gate, and an active circuit network including at least one transistor; the active circuit network constituting a negative feedback circuit network formed with part of a positive feedback loop in the PNPN switch, the transistor of the active circuit network being connected in such a manner as to divide at least one of the gate currents of the PNPN switch.

The above and other objects, features and advantages of the invention will be made apparent by the detailed description taken in conjunction with the accompanying drawings, in which.

Figure 1:
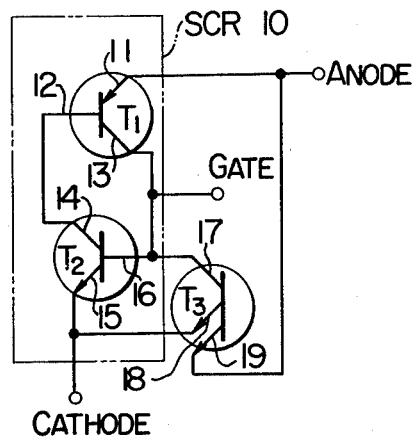
FIG. 1 and FIG. 2 are circuit diagrams showing conventional devices most analogous to the present invention.
Figure 2:
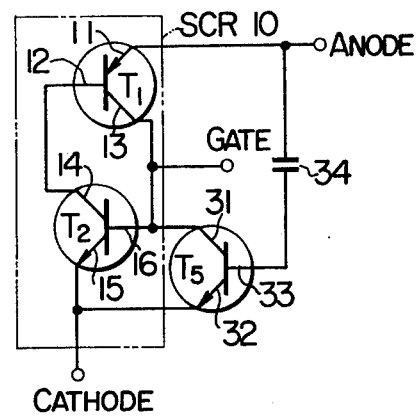
Figure 3:
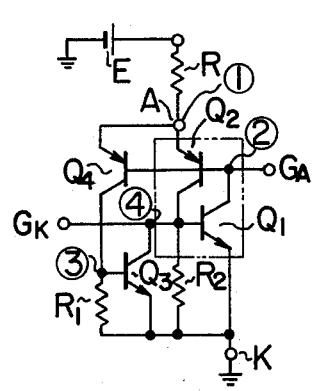
FIG. 3 is a diagram showing an equivalent circuit of the semiconductor switch according to a first embodiment of the present invention.

In FIG. 3 showing a diagram of an equivalent circuit of the semiconductor switch according to a first embodiment of the invention, reference symbols $Q_1$ and $Q_2$ show an NPN transistor and a PNP transistor respectively constituting a PNPN switch, symbols $Q_3$ and $Q_4$ transistors, and $R_1$ and $R_2$ resistors, which, together with the transistors $Q_3$ and $Q_4$, make up an active circuit and are connected in parallel to the PNPN switch. Symbol E shows a power supply, and symbol R a series resistance of the line in which the switch is inserted.

This PNPN switch has a positive feedback loop of the base of transistor $Q_1$—the collector of transistor $Q_1$—the base of transistor $Q_2$—the collector of transistor $Q_2$—the base of transistor $Q_1$. Upon receipt of a gate current, the transistors $Q_1$ and $Q_2$ enter an active state, and when the gain of the positive feedback loop reaches one or more, the device is rapidly switched, so that both the transistors $Q_1$ and $Q_2$ are turned on at the same time. As a result, the circuit between the anode A and cathode K conducts, and this conductive state is maintained.

As shown in the drawing, the semiconductor switch according to the invention has also a negative feedback loop of the base of transistor $Q_4$—the collector of transistor $Q_4$—the base of transistor $Q_3$—the collector of transistor $Q_3$—the base of transistor $Q_1$—the base of transistor $Q_4$. Namely, a signal applied to the base GA of the transistor $Q_4$ is fed back to the base of the transistor $Q_1$ after it is amplified and inverted in its phase by the transistors $Q_4$ and then amplified and inverted in its phase again by the transistor $Q_3$, so that the transistors $Q_3$ and $Q_4$ will constitute a DC amplifier which is connected between the terminal GA and the base of the transistor $Q_1$ and does not invert the phase of the signal applied to the input thereof. If this complicated circuit including both positive and negative feedback loops at the same time is to effect a switching operation with the feedback action of one or more in loop gain, the determinant of the circuit of FIG. 3 must be negative. Let the current gains of the transistors $Q_1$, $Q_2$, $Q_3$ and $Q_4$ be $\beta_1$, $\beta_2$, $\beta_3$ and $\beta_4$ respectively, and the condition for a negative circuit determinant of the circuit of FIG. 3 is approximately expressed by $$\beta_1(\beta_2 - \beta_3\beta_4) - 1 > 0 \ldots\ldots\ldots \quad (1)$$

It will be seen that the left side of this inequality (1) represents an effective positive feedback gain. When the characteristics of the transistors are determined to satisfy this condition, the switching operation of the whole circuit of FIG. 3 is made possible. The negative feedback circuit compensates for the variations in current gain resulting from possible variations in temperature or quality of product lots, thus bringing about a stable effective positive feedback gain.

As to the protection against the $dv/dt$ effect which constitutes one of the objects of the invention, the state of the circuit impressed with a transient voltage may be discussed with reference to FIG. 4. Since the base and emitter of transistors $Q_1$ and $Q_3$ of FIG. 3 are short-circuited with each other through resistors $R_2$ and $R_1$ respectively, neither the transistor $Q_1$ nor transistor $Q_3$ operates until the voltage drop in the resistors $R_2$ and $R_1$ reaches to the built-in voltage thereof (generally, approximately 0.6V). Therefore, by way of explanation, the transistors $Q_1$ and $Q_3$ are omitted from the circuit of FIG. 4. In this drawing, the capacitance $C_1$ is a junction capacitance between the base and collector of the transistor $Q_4$, and the capacitance $C_2$ a junction capacitance between the base and collector of the transistor $Q_2$. Referring to the closed state of switch S, the following approximate inequality (2) must be satisfied in order that the potential at the terminal 3 is always higher in the transient state than that at the terminal 4:

$$C_1R_1 > \frac{(1+\beta_2)}{(1+\beta_4)} C_2R_2 \qquad (2)$$

Figure 4:
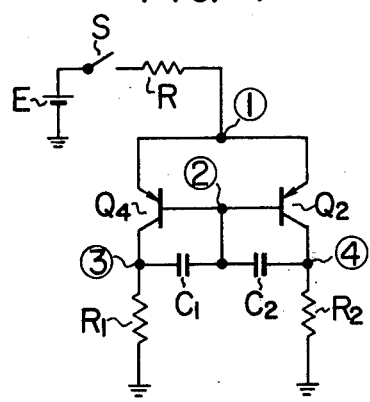
FIG. 4 is a circuit diagram equivalent to FIG. 3 and showing the case where the PNPN transistor becomes active in response to a step voltage applied to the anode thereof.

In other words, the condition that the potential at the terminal 3 is always higher than that at the terminal 4 in FIG. 4 is equivalent to the fact in FIG. 3 that, before the potential at the terminal 4 reaches to the built-in voltage of the transistor $Q_1$, if ever, the potential at the terminal 3 takes a sufficient value to energize the transistor $Q_3$. Therefore, by determining the circuit constants to satisfy the inequality (2), the transient current flowing from the collector of the transistor $Q_2$, namely, the current supposed to flow in the base of the transistor $Q_1$, bypasses the transistor $Q_1$ and flows into the transistor $Q_3$ in a saturated state. As a result, the transistor $Q_1$ is not turned on, so that the whole circuit of FIG. 3 is maintained in nonconducting state, thus achieving a great stability against a transient state. This advantage is attained without any power supply or other external control circuit or even when the anode potential changes to a high level or the cathode potential is decreased.

As will be understood from the foregoing description, the circuit of FIG. 3 satisfying both the inequalities (1) and (2) at the same time has the following advantages:

a. A very great $dv/dt$ bearing capacity is achieved regardless of the potential at the anode or cathode;

b. In view of the fact that the absolute value of the ratio between the values of resistors $R_1$ and $R_2$ expressed by the inequality (2) can be selected as desired, the value of the resistor $R_2$ may be rendered very high as compared with the conventional devices, with the result that the circuit is capable of being triggered with a very high sensitivity by applying a gate current to the base of transistor $Q_1$.

c. The fact that the ratio between the resistance values of resistors $R_1$ and $R_2$ is constant offers a great convenience in integrating the circuits and provides a stable circuit against any possible variations in resistance due to variations in the quality of product lots.

d. Due to the fact that the circuit comprises component elements facilitating circuit integration and that the transistors $Q_3$ and $Q_4$ are connected in the same mode of polarity as the transistors $Q_1$ and $Q_2$ making up the original PNPN switch, the advantage that the PNPN switch has a high breakdown voltage both in positive and negative directions remains unlost.

3. The fact that the connection of transistors $Q_1$ and $Q_2$ is substantially similar to that of transistors $Q_3$ and $Q_4$ permits the circuit to operate always stably even against high speed pulses applied thereto.

An additional qualitative description will be made of the semiconductor switch according to the first embodiment of the invention shown in FIG. 3. In the embodiment under consideration, the transistors $Q_3$ and $Q_4$ function to correct the effective positive feedback gain and, during the transient time, the transistor $Q_3$ causes the PNPN switch to be shortcircuited between the cathode gate $G_K$ and the cathode K. The resistor $R_2$ determines on one hand a gate sensitivity, but contributes to $dv/dt$ bearing capacity against a slow rise of a voltage or a small $dv/dt$ value so that is is possible to use a high resistance value of resistor $R_2$. The resistor $R_1$, on the other hand, contributes to providing the circuit with a necessary time constant. By the way, the resistor $R_1$ may be increased substantially infinitely in value or eliminated in so far as it suffices if the inequality (2) is satisfied. The results of tests conducted by the inventor show that the PNPN switch and an incidental active circuit having the transistor characteristics of $\beta_1 \approx \beta_3 \approx 20$, $\beta_2 = 1.5$, $\beta_4 \approx 0.05$ and $C_1 \approx C_2 \approx 2pF$ were 500v/$\mu$s or more in $dv/dt$ bearing capacity in the presence of resistors $R_1$ of about 50 K$\Omega$ and $R_2$ about 20 K$\Omega$, resulting in the gate sensitivity of about 30 $\mu$A. This compares with a low approximately 15v/$\mu$s in $dv/dt$ bearing capacity in the case where the same gate sensitivity is obtained by inserting a resistor between the cathode gate $G_K$ and cathode K of the PNPN switch as in the prior art. Thus, the $dv/dt$ bearing capacity has been improved about 30 times by the invention. By the way, in determining the value of the time constant of the circuit by the resistor $R_2$, the prevention of erroneous turning on of the PNPN switch by leak current at high temperatures is another factor to be taken into consideration.

Figure 5:
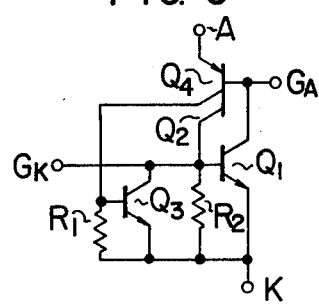
FIG. 5 is a diagram showing an equivalent circuit of the semiconductor switch according to a second embodiment of the invention wherein the two transistors are of multi-collector construction.

The diagram of FIG. 5 shows an equivalent circuit of the semiconductor switch according to the second embodiment of the invention, in which the transistors $Q_2$ and $Q_4$ in the circuit of FIG. 3 are replaced by the ones of multi-collector type and which are quite suitable for the purpose of circuit integration.

Figure 6:
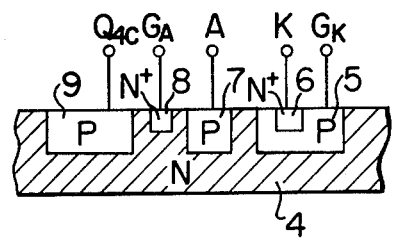
FIG. 6 is a partial sectional view of the circuit of FIG. 5 wherein part of the circuit is integrated.

Referring to FIG. 6 showing a partial sectional view of the construction of integrated circuits including the transistors $Q_1$, $Q_2$ and $Q_4$ of the equivalent circuit shown in FIG. 5, reference numeral 4 shows an anode gate region, numeral 5 a cathode gate region, numeral 6 a cathode region, numeral 7 an anode region, numeral 8 an anode gate contact region, and numeral 9 the collector region of the transistor $Q_4$. The NPN transistor $Q_1$ is made up of the regions 4, 5 and 6; the lateral PNP transistor $Q_2$ of the regions 7, 4 and 5; and the lateral PNP transistor $Q_4$ of the regions 7, 4 and 9. If a high breakdown voltage is to be obtained while employing lateral transistors as in the case of FIG. 6, the current gain of the transistor $Q_2$ is small and therefore the current gain of the transistor $Q_4$ is very small value as derived from the inequality (1). Under this condition, the capacity of $C_1$ may be any other capacitive element than a junction capacity of transistors if its value satisfies the inequality (2).

In view of the fact that the inequality (2) is satisfied even if $\beta_4$ is made zero by eliminating the transistor $Q_4$, the same effective operation as that of the circuit of FIG. 6 may be performed by inserting a capacitor $C_1$ capable of satisfying the inequality (2) in place of the transistor $Q_4$. In other words, the same advantage results from inserting a capacitive element between the base of transistor $Q_2$ and the base of the transistor $Q_3$ of the circuit shown in FIG. 5.

Figure 7:
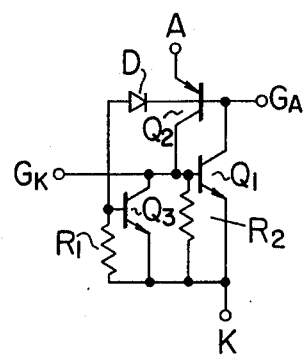
FIGS. 7, 8 and 9 are diagrams showing equivalent circuits of the semiconductor switch according to third, fourth and fifth embodiments of the invention.

An equivalent circuit of the semiconductor switch according to the third embodiment of the invention is shown in FIG. 7, wherein a diode D is inserted between the base of the transistor $Q_2$ and the base of transistor $Q_3$.

Figure 8:
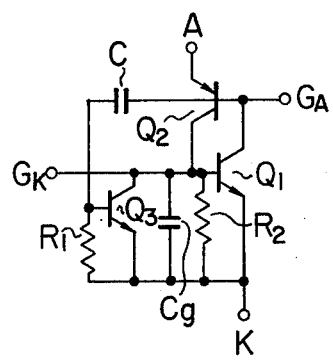

Also, the equivalent circuit of the semiconductor switch according to the fourth embodiment of the invention as shown in FIG. 8 is characterized by the capacitor C inserted between the base of the transistor $Q_2$ and the base of the transistor $Q_3$. Incidentally, the capacitor Cg in the drawing which is connected in parallel to the resistor $R_2$ is for protecting the circuit from the transient voltage applied from the gate terminal $G_K$.

Figure 9:
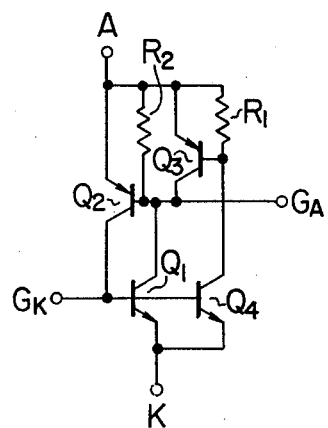

The diagram of FIG. 9 shows an equivalent circuit of the semiconductor switch according to the fifth embodiment of the invention, in which the shortcircuiting transistor $Q_3$ in the equivalent circuit according to the first embodiment of the invention shown in FIG. 3 is connected to the PNP transistor $Q_2$ side, and which operates in the same manner as the circuit of FIG. 3.

Figure 10:
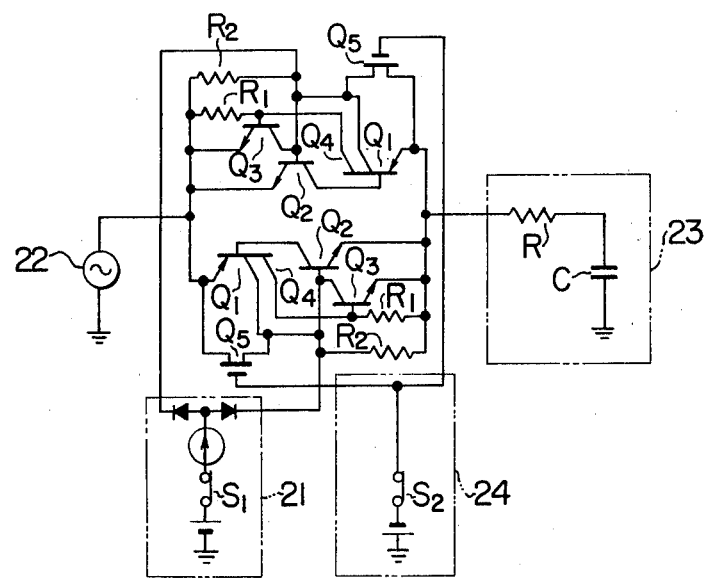
FIG. 10 is a diagram showing an equivalent circuit of a sixth embodiment of the invention used as a bidirectional speech path switch including a plurality of semiconductor switches of the invention connected in parallel in opposite directions.

FIG. 10 shows the sixth embodiment of the invention, which is used as a speech path switch having bidirectional characteristics by connecting a plurality of semiconductor switches according to the invention, and shows an equivalent circuit simulating the case in which a ringing signal of the telephone is passed.

In the drawing under consideration, reference symbols $Q_1$ and $Q_2$ show PNP and NPN transistors respectively making up the PNPN switch, symbol $Q_3$ a switching transistor for protection of the device from the $dv/dt$ effect, and symbol $Q_4$ a PNP transistor comprising a P-type anode and N-type cathode which is produced by forming another P-type region in the anode gate region of the PNPN switch. Symbol $Q_5$ shows an insulated-gate field effect transistor for voltage control, symbol $R_2$ a resistor for protecting the device from a small $dv/dt$ effect, and symbol $R_1$ a resistor for preventing the transistor $Q_3$ from being turned on under normal operating conditions or due to a small $dv/dt$ effect and at the same time serving as a discharge path of the stored charges. Reference numeral 21 shows a cathode gate driving circuit, numeral 22 a signal source, numeral 23 a capacitive load, and numeral 24 an insulated-gate driving circuit for the insulated-gate field effect transistor $Q_5$. The circuit of FIG. 10 refers to the PNPN switch in a single stage, as the operating principle is the same regardless of the number of stages in which the PNPN switches are connected.

Figure 11:
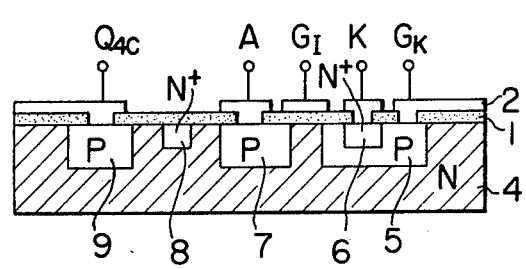
FIG. 11 is a partial sectional view of the circuit of FIG. 10 part of which is integrated.

Reference is made to FIG. 11 showing a partial sectional view of an example of the construction of the device of FIG. 10, in which the transistors $Q_1$, $Q_2$, $Q_3$ and $Q_4$ are included in integrated circuits. In the drawing in question, reference numeral 4 shows an anode gate region, numeral 5 a cathode gate region, numeral 6 a cathode region, numeral 7 an anode region, and numeral 8 an N$^+$—type region for reducing the emitter-grounded current gain $H_{FE}$ of the transistor $Q_4$ and used for taking out an anode gate electrode. Reference numeral 9 shows a collector region of the transistor $Q_4$, numeral 1 an oxide film, numeral 2 an aluminum electrode, symbol A an anode electrode, symbol $G_K$ a cathode gate electrode, symbol K a cathode, GI the gate electrode of the field effect transistor $Q_5$, and symbol $Q_{4C}$ the collector electrode of the transistor $Q_4$.

Figure 12:
FIG. 12 shows waveforms of AC current and voltage in the case where a capacitive load is inserted.

Let us consider the case in which the switches $S_1$ and $S_2$ are closed to allow an AC signal to pass the PNPN switch as shown in FIG. 10. Under this condition, the waveform of current $i(t)$ leads in phase the voltage waveform $v(t)$ by a maximum phase difference of about 90° as shown in the diagram of FIG. 12. When the current $i(t)$ is reduced to a point below a self-holding level where the gate current must be supplied to maintain the current, the cathode voltage is at a positive or negative maximum or thereabouts. In the event that the cathode voltage level is negative, the gate current is capable of being supplied even if the driving voltage of the cathode gate driving circuit 21 is low. In this case, the field effect transistors $Q_5$ are unable to be turned on with a low driving voltage. On the contrary, at a positive level of the cathode, supply of current from the cathode gate driving circuit 21 requires a high voltage. Since each of the substrate of the field effect transistors $Q_5$ is at a high positive potential, however, the field effect transistors $Q_5$ are capable of being turned on and hence current can be supplied from the anode terminal to cathode gate, by applying a low negative driving voltage from the insulated gate driving circuit 24 to the insulated gate of the field effect transistors $Q_5$. Also, in the case where the load 23 is inductive, the device can be easily driven by way of the field effect transistor at a positive cathode level, or by way of the cathode gate at a negative cathode level. In spite of the fact that the driving circuit 24 of the field effect transistor is shown in the form of a negative power supply in the circuit of FIG. 10, the gate may of course be maintained at earth level if the threshold voltage Vth of the field effect transistor is reduced, or alternatively, the device may be driven with a low positive voltage from a positive power supply. Further, the driving circuits 21 and 24 may take the form of pulse-producing driving circuits.

Furthermore, since the anode gate is also used as a current control terminal, three additional configurations are available based on different combinations of the current control element and the voltage control element. Such possibilities include a method in which the anode gate is used as the current control element and the voltage control is made by connecting an N-channel field effect transistor between anode gate and cathode; a method in which the cathode gate is used as the current control element and a P-channel field effect transistor is inserted between anode gate and cathode; or a method in which the anode gate is used as the current control terminal and an N-channel field effect transistor is inserted between the anode and cathode gate. Each of these field effect transistors may be integrated with the PNPN switch as shown in FIG. 11 or alternatively be provided separately.

Next, let us consider the case in which the voltage transient $dv/dt$ is applied between the anode and cathode when the PNPN switch of FIG. 10 is in cut-off state. First, when a large $dv/dt$ is involved, the base current flows to the transistor $Q_3$ through the base-collector junction of the transistor $Q_4$ whereupon the transistor $Q_3$ is turned on, so that, by absorbing the current flowing through the base-collector junction of the transistor $Q_1$ in the saturated region of the transistor $Q_3$, it is possible to prevent the PNPN switches $Q_1$ and $Q_2$ from being closed. On the contrary, the PNPN switch will be unable to be closed in the event that the transistor $Q_3$ conducts in the saturated region even under the normal operating condition. Therefore, to prevent such a situation, a resistor $R_2$ is inserted between the base and emitter of the transistor $Q_3$. As a result, the transistor $Q_3$ is not turned on when a small $dv/dt$ is applied, in which case the resistor $R_1$ is used for protection. In this way, unlike the conventional device, the resistor $R_1$ may be used to protect the device from a small $dv/dt$ effect and therefore increased in resistance, with the result that the PNPN switch may be closed with a small cathode gate current. In view of the fact that the transistor $Q_3$ may be operated only during the transient period when the $dv/dt$ is applied, the circuit for supplying a base current thereto may take the form of a capacitive element, and either a diode or a capacitor may be employed in place of the transistor $Q_4$. Of course, the capacitive elements may be connected in parallel to the resistor $R_1$. Further, the device according to the invention may be arranged in a configuration based on the same operating principle as that of the preceding embodiments or such that a transistor for $dv/dt$ protection and an impedance element may be inserted between the anode and anode gate of the PNPN switch, so that the transistor for $dv/dt$ protection may be driven by a capacitive element.

As will be understood from the foregoing description, the semiconductor switch according to the present invention is such that the active circuit network inserted in parallel to the PNPN switch, together with part of the positive feedback loop of the PNPN switch, makes up a negative feedback circuit; and a current substantially in phase with the current flowing in the base resistor $R_2$ of the transistor $Q_1$ through the PNP transistor $Q_2$ including the junction capacitance $C_J$ is rendered to flow in the parallelconnected active circuit network, so that the base current of the transistor $Q_1$ is bypassed by the transistor $Q_3$ whose the collector is connected to the base of the transistor $Q_1$, thus making it possible to maintain the effective DC positive feedback loop gain of the whole device more than one.

Furthermore, the PNPN switch of the semiconductor switch according to the present invention is provided with a voltage control terminal taking advantage of a field effect transistor, which, in combination with a conventional current control system, permits the PNPN switch to be closed with a small control voltage even against floating of the cathode potential level. In addition, the parallel connection of an impedance element and a switching element for protection of the device from the $dv/dt$ effect makes possible a PNPN switch with a large $dv/dt$ bearing capacity which is capable of being closed with a small control current.

It will thus be seen that the objects set forth above, among those made apparent from the preceding description, are efficiently attained, and since certain changes may be made in the above construction without departing from the spirit and scope of the invention, it is intended that all matters contained in the above description or shown in the accompanying drawings shall be interpreted as illustrative and not in a limiting sense.

What is claimed is:

1. A semiconductor switch comprising:
    a PNPN switch having at least three PN-junctions and having a P-type anode, an N-type gate, a P-type gate and an N-type cathode;
    switching means having input, output, and control terminals;
    a passive element; and driver means for driving the control terminal of said switching means, the input and output terminals of said switching means and said passive element both being connected across one of said PN-junctions at one end of said PNPN switch; with said drive means supplying to the control terminal of said switching means a current divided from a current flowing through another one of said PN-junctions at another end of said PNPN switch thereby driving said switching means.

2. A semiconductor switch according to claim 1, wherein said PNPN switch includes an NPN transistor and a PNP transistor; an N-type collector of said NPN transistor being connected to an N-type base of said PNP transistor and a P-type collector of said PNP transistor being connectecd to a P-type base of said NPN transistor.

3. A semiconductor switch comprising:
a PNPN switch having at least three PN-junctions and having a P-type anode, an N-type gate, a P-type gate and an N-type cathode;
a first transistor;
a second transistor; and
an impedance element, said impedance element being connected between a collector and emitter of said first transistor; said collector and emitter of said first transistor being respectively connected to a P-type gate and an N-type cathode of said PNPN switch, said second transistor being connected at its emitter and base to said P-type anode and N-type gate of said PNPN switch, respectively, said second transistor being connected at its collector to a base of said first transistor.

4. A semiconductor switch comprising:
a PNPN switch having four PN-junctions and having a P-type anode, an N-type gate, a P-type gate, and an N-type cathode, and a P-type collector, said P-type collector being disposed adjacent to the region of said N-type gate;
a transistor; and
an impedance element; said impedance element being connected between a collector and emitter of said transistor, said collector and emitter being respectively connected to a P-type gate and an N-type cathode of said PNPN switch, a base of said transistor being connected to said P-type collector of said PNPN switch.

5. A semiconductor switch comprising:
a PNPN switch having three PN-junctions having a P-type anode, an N-type gate, a P-type gate, and an N-type cathode;
a transistor;
an impedance element, and
a capacitive element, said impedance element being connected between a collector and emitter of said transistor, said collector and emitter being respectively connected to said P-type gate and N-type cathode of said PNPN switch, a base of said transistor being connected through said capacitive element to said N-type gate of said PNPN switch.

6. A semiconductor switch according to claim 5, wherein said capacitive element consists of a diode.

7. A semiconductor switch according to claim 5, wherein said capacitive element consists of a capacitor.

8. A semiconductor switch according to claim 1, wherein said semiconductor switch includes a field effect transistor having a source terminal, a gate terminal and a drain terminal, the source and drain terminals of said field effect transistor being connected to said P-type anode and P-type gate of said PNPN switch and said gate terminal of said field effect transistor being used for a voltage control of said semiconductor switch.

9. A semiconductor switch according to claim 1, wherein said semiconductor switch includes a field effect transistor having source, gate, and drain terminals, said field effect transistor comprises said P-type anode and P-type gate of said PNPN switch and an insulated electrode disposed between said P-type anode and P-type gate of said PNPN switch, said insulated electrode being the gate terminal of said field effect transistor.

* * * * *